May 6, 1969 R. R. BOCKEMUEHL 3,443,101

LIGHT SENSITIVE CIRCUIT EMPLOYING A ZENER DIODE IN SERIES WITH THE PHOTOCONDUCTIVE DEVICE

Filed Aug. 9, 1965

INVENTOR.
Robert R. Bockemuehl
BY
Robert E. Fowler
ATTORNEY

United States Patent Office 3,443,101
Patented May 6, 1969

3,443,101

LIGHT SENSITIVE CIRCUIT EMPLOYING A ZENER DIODE IN SERIES WITH THE PHOTOCONDUCTIVE DEVICE

Robert R. Bockemuehl, Bloomfield Hills, Mich., assignor to General Motors Corporation, Detroit, Mich., a corporation of Delaware Filed Aug. 9, 1965, Ser. No. 478,327
Int. Cl. H01j *39/12*
U.S. Cl. 250—206 4 Claims

ABSTRACT OF THE DISCLOSURE

A light sensitive control system employing in series a Zener diode and a semiconductor photo device. The Zener diode and photo device are together connected across a DC source. Changes in ambient light are sensed by the photo device and cause an output control signal to be developed across the Zener diode. An AC source, when connected across the Zener diode, enables the presence of light to be reflected by whether or not the output control signal is alternating.

This invention relates to light sensitive control means and more particularly to practical light sensitive control means utilizing semiconductor detector elements useful at relatively low values of light intensity.

It has not been practical heretofore to utilize solid state photosensensitive devices in low light intensity situation where fast response time is required. As an example of such a case, but in nowise limiting the present disclosure, is the application of light sensitive control means to the dimming of automobile headlamp systems on the approach of cars from the opposite direction. In such application the control circuit must respond to light intensities in the range of .001 to .01 foot-candle having a power density of .01 microwatt per square centimeter to operate a relay in one second or less. Up to the present the only light sensitive devices that have been used in such circuits have been phototubes.

Semiconductor photo devices have the advantage of a large power amplification factor which would make these elements very desirable in such a usage. They ordinarily have present, however, certain non-practical characteristics such as low ratio dark to light resistance, long response time and impedance matching problems.

It is an object in making this invention to provide a light sensitive semiconductor control circuit which operates at relatively low light intensities to provide practical switching speeds.

It is a further object in making this invention to provide an economical, simple, semiconductor photo device controlled circuit for practical purposes.

It is a still further object in making this invention to provide a semiconductor photosensitive control circuit in which there is a high ratio of dark to light signal, said system capable of being matched to low impedance amplifying or following circuits and in which component tolerances are reasonable.

With these and other objects in view which will become apparent as the specification proceeds, my invention will be best understood by reference to the following specification and claims and the illustrations in the accompanying drawings, in which:

Figure 1:
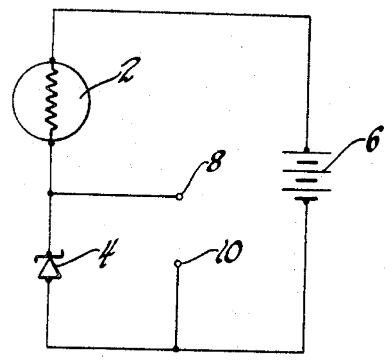
FIG. 1 is a circuit diagram illustrating the basic principle of my invention.

The first basic principle incorporated in my control circuit is to use a Zener diode in series circuit with the semiconductor photo device and then bias same for operation about its critical value so that the light range in which the device is to be used will cause the voltage applied to fluctuate back and forth around what might be called the operating point or critical value of the diode for switching purposes. FIG. 1, therefore, illustrates this basic principle and in this figure there is shown a light sensitive semiconductor device 2 which is connected in series with a Zener diode 4 across a source of voltage illustratively shown as battery 6. The parameters of the circuit are selected so that with the ambient light fluctuating between the known levels the voltage across the Zener diode will fluctuate around the critical breakdown value. The operation will be explained with reference to the voltage across the diode 4 which will, of course, appear across the terminals 8–10.

Figure 2:
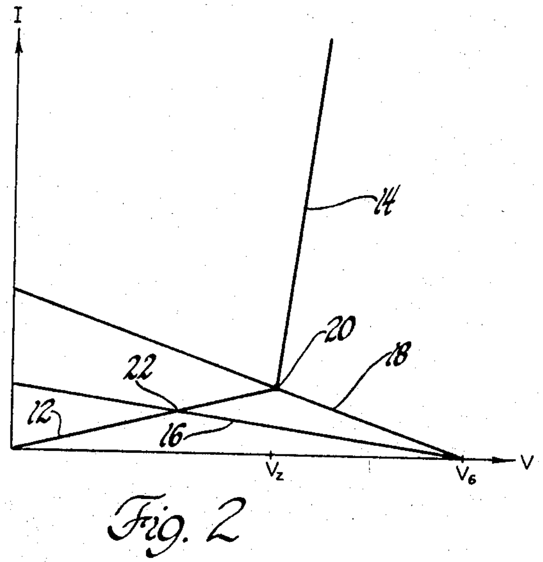
FIG. 2 is a graph showing various current-voltage relationships.

Referring now more particularly to FIG. 2 the current-voltage characteristic curve of the Zener diode 4 is shown by the upwardly sloping line 12 which starts from the origin and gradually extends upward. The diode resistance is high at voltages less than the critical or breakdown voltage which is shown at $V_Z$. At that point the diode resistance decreases abruptly and, therefore, the current increases rapidly with voltage rise as shown by the almost vertically extending portion of the same curve shown at 14. On the same figure, line 16 represents the series load characteristic of the cell 2 in the dark, the slope of this line indicating the resistance. When light falls upon the photocell 2 the resistance, of course, decreases and this impresses a greater voltage across the diode 4 since the voltage drop across the photocell is less. A certain threshold level of light intensity where the photocell resistance at light levels at which the cell is to be operated occurs, is represented by curve 18. This curve, therefore, represents the level at which it is desired to have the system trigger or operate. The slope of this line indicates the resistance of the photocell at the operating light level. This level is so much lower than the other that the actual difference in slope of the two lines cannot indicate the great difference in resistance under the dark and light conditions which can be easily as much as $10^5$ ohms. Therefore, since curve 18 represents the level at which it is desired that the light sensitive device trigger, and since the critical point of the diode intersects that curve at point 20 this becomes the critical operating point under the assumed circumstances.

At the point where the diode curve 12 crosses the dark operating characteristic curve or point 22, the effective diode resistance is very high and the combination of the photocell dark resistance and the diode pre-break down resistance is high. This can easily be $10^5$ ohms or greater. However, upon reaching point 20 or the critical point and having the Zener diode break down its value can drop to a few ohms or less. Therefore, the ratio of the so-called dark to light resistance or the dark to light current across terminals 8–10 is very high. This effect can overcome many of the previously known difficulties encountered in using a plain semiconductor photo device in a control circuit.

Figure 3:
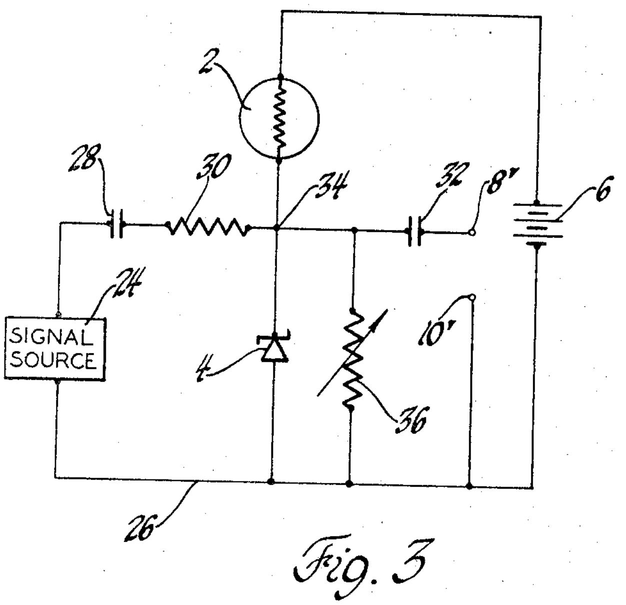
FIG. 3 is a complete light sensitive control circuit embodying my invention; and, FIG. 4 is a circuit similar to that of FIG. 3 but of much more simplified form.

In order to obtain the full benefit of this effect it is further necessary to apply a modulating current to the light sensitive circuit in order to compare dynamic resistance changes since the DC resistances at terminals 8–10 do not exhibit this change in sufficient clarity. Such a complete circuit is shown in FIG. 3. In this case we find the same elements insofar as the light sensitive semiconductor device 2 and the Zener diode 4 are concerned and these are, as previously, connected in series circuit across the source of power 6. However, in this case an AC signal source 24 has one terminal connected to line 26 which extends across to one terminal of the Zener diode 4. The other side of the signal source 24 is connected through condenser 28 in series with resistance 30 to a midpoint 34 between the semiconductor photo device 2 and the Zener diode 4. This appiles an alternating signal to the series circuit. The actual value of the resistor 30 is less than the dark resistance at terminal 34 but greater than the threshold resistance at that point. Therefore, when no light falls on the photosensitive cell 2 the AC signal from source 24 reaches output terminals 8′–10′ with negligible attenuation. This, of course, passes through additional coupling capacitor 32 connected between the Zener diode and terminal 8′.

At light intensities above the critical value, the resistance at point 34 drops abruptly and almost all of the alternating current from source 24 is dissipated across resistance 30 and practically none appears across the output 8′–10′. Thus, the presence of a threshold or critical value of light intensity on the photocell 2 results in the presence or absence, respectively, of an alternating current signal output across contacts 8′–10′. This can be very critically adjusted to occur at a desired point and it requires a relatively small change in the resistance of the photocell 2. The AC signal source 24 is not at all critical and other factors involved are also not critical and a wide tolerance may be utilized. The signal voltage applied may be relatively small with respect to the supply voltage. The capacitors 28 and 32 isolate the DC voltage so that point 34 is not dependent upon any resistance from the signal source or other circuits connected across contacts 8′–10′. The output resistance across terminals 8′–10′ is determined by the resistance 30 and can be relatively low. This permits coupling into low impedance transistorized circuits for amplification or relay energization. A variable resistor 36 is connected in shunt to the Zener diode 4 and the adjustment of this resistor permits the critical point and slope of curve 12 to be adjusted at will. It also permits greater tolerances to be used in the other components used in the circuit.

Figure 4:
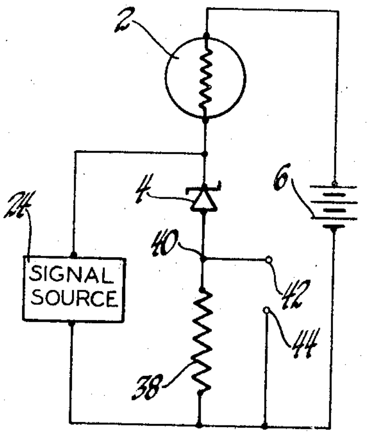

The circuit shown in FIG. 4 is comparable to that shown in FIG. 3 except that it has been much simplified. It is a much cheaper system as is evident since it lacks some of the components and the refinements of the system shown in FIG. 3 but may be adequate for some installations. In that case the AC signal source 24 is used as in FIG. 3. However, a resistance 38 is now connected in series circuit with the Zener diode 4 and the semiconductor photocell 2 across the power source 6. The intermediate point 40 between the Zener diode and the resistance 38 is utilized as one of the output terminals 42, the other output terminal 44 being directly connected to one terminal of the battery, the opposite terminal of the resistor, and one terminal of the signal source. As in the case of FIG. 3, the principle is the same but the operation is reversed in that where, in FIG. 3 an AC signal appeared across terminals 8′–10′ when no light fell on the photocell 2 and disappeared when a light signal fell thereon, in this case no signal appears across the terminals 42–44 in the absence of light but a signal appears when the photocell is illuminated. This is due to the fact that the AC signal from source 24 is blocked by the Zener diode 4 when its resistivity is high and, therefore, does not appear across the terminals but is applied thereto when the Zener diode breaks down due to the change in voltage thereacross by the change in conductivity of the photocell 2.

What is claimed is:

1. In a light sensitive control system, a source of DC electrical power, a photosensitive semiconductor element, a voltage reference diode having a reverse breakdown voltage at a desired control level of the system connected in series with said photosensitive semiconductor element across the source of DC electrical power so as to be reverse biased, a pair of output terminals connected across the voltage reference diode so that the change in voltage thereacross at the critical level produced by the variation in voltage across the photosensitive semiconductor element provides a control signal created by change in ambient radiation, and a source of alternating current connected in shunt to the voltage reference diode to apply a modulating voltage thereto.

2. In a light sensitive control system, a source of DC electrical power, a photosensitive semiconductor element, a Zener voltage reference diode having a reverse breakdown voltage at a desired level of the system connected in series with said photosensitive semiconductor element across the source of DC electrical power so as to be reverse biased, a pair of output terminals connected across the reference voltage diode so that the change in voltage thereacross at the critical level produced by the variation in voltage across the photosensitive semiconductor element provides a control signal created by change in ambient radiation, a source of alternating current connected in shunt to the voltage reference diode to apply a modulating voltage thereto, and an impedance means in series with the alternating current source across which the voltage is dropped under certain conditions.

3. In a light sensitive control system, a source of DC electrical power, a photosensitive semiconductor element, a Zener diode having a reverse breakdown voltage at a desired control level of the system connected in series with said photosensitive semiconductor element across the source of DC electrical power so as to be reverse biased, a pair of output terminals connected across the Zener diode so that the change in voltage thereacross at the critical level produced by the variation in voltage across the photosensitive semiconductor element provides a control signal created by change in ambient radiation, a source of alternating current connected in shunt to the Zener diode to apply a modulating voltage thereto, an impedance means in series with the alternating current source across which the voltage is dropped under certain conditions, and capacitor means between the alternating current source and the Zener diode and also between the output terminals and the Zener diode to block the DC current in these paths so that with no light falling on the photosensitive semiconductor element an alternating current signal will appear across the output terminals and with light present the signal will disappear.

4. In a light sensitive control system, a source of DC electrical power, a semiconductive photocell, a Zener diode having a predetermined breakdown voltage, a resistance, said semiconductor photocell, Zener diode and resistance being connected in series circuit relation across the source of DC electrical power with the Zener diode biased in the reverse direction, a source of alternating current power connected in shunt to that portion of the series circuit including the Zener diode and the resistance to impress AC current thereacross, a pair of output terminals connected across the resistance so that in the absence of light on the photocell no signal will appear across the output terminals but when light appears to change the resistance of the photocell and the voltage drop thereacross and across the Zener diode to cause the same to break down, an AC signal will appear across the output terminals to indicate the presence of radiation.

References Cited

IBM Technical Bulletin, vol. 4, No. 5, October 1961, article by A. J. Blodgett, Jr., pp. 44 and 50.

IBM Technical Bulletin, vol. 4, No. 12, May 1962, article by M. Masetti, p. 71.

JAMES W. LAWRENCE, *Primary Examiner.*

E. R. LA ROCHE, *Assistant Examiner.*

U.S. Cl. X.R.

307—311

PO-1050
(5/69)

UNITED STATES PATENT OFFICE
CERTIFICATE OF CORRECTION

Patent No. 3,443,101 Dated May 6, 1969

Inventor(s) Robert R. Bockemuehl

It is certified that error appears in the above-identified patent and that said Letters Patent are hereby corrected as shown below:

Column 1, line 30, "photosensensitive" should be -- photosensitive --; same line, "situation" should be -- situations --.

Column 3, line 28, "appiles" should be -- applies --.

Column 4, line 18, "voltage reference" should be -- Zener --; line 23, "voltage reference" should be -- Zener --; line 28, "voltage reference" should be -- Zener --; line 32, delete "voltage reference"; line 33, after "desired" insert -- control --; line 37, "reference voltage" should be -- Zener --; line 42, "voltage reference" should be -- Zener --.

Column 6, line 3, "pp. 44 and 50" should be -- pp. 49 and 50 --.

SIGNED AND SEALED
MAY 19 1970

(SEAL)
Attest:

Edward M. Fletcher, Jr.
Attesting Officer

WILLIAM E. SCHUYLER, JR.
Commissioner of Patents